(12) United States Patent
Matsushima

(10) Patent No.: US 8,324,942 B2
(45) Date of Patent: Dec. 4, 2012

(54) CLOCK SIGNAL AMPLIFICATION CIRCUIT, CONTROL METHOD THEREOF, AND CLOCK SIGNAL DISTRIBUTION CIRCUIT

(75) Inventor: Yusuke Matsushima, Tokyo (JP)

(73) Assignee: NEC Corporation, Tokyo (JP)

( * ) Notice: Subject to any disclaimer, the term of this patent is extended or adjusted under 35 U.S.C. 154(b) by 83 days.

(21) Appl. No.: 12/891,920

(22) Filed: Sep. 28, 2010

(65) Prior Publication Data

US 2011/0084754 A1    Apr. 14, 2011

(30) Foreign Application Priority Data

Oct. 9, 2009   (JP) .................................. 2009-235012

(51) Int. Cl.
*H03K 5/22* (2006.01)
(52) U.S. Cl. ......................................................... 327/69
(58) Field of Classification Search ........................ None
See application file for complete search history.

(56) References Cited

U.S. PATENT DOCUMENTS 7,095,667 B2 *   8/2006   Baker ............................ 365/207
7,180,352 B2 *   2/2007   Mooney et al. ................ 327/237

FOREIGN PATENT DOCUMENTS

JP          2008227696 A       9/2008

* cited by examiner

*Primary Examiner* — Lincoln Donovan
*Assistant Examiner* — Sibin Chen

(57) ABSTRACT

In an exemplary aspect of the invention, a clock signal amplifier circuit includes an amplifier circuit, a first switch part, and a second switch part. The amplifier circuit amplifies a clock signal. The first switch part controls ON/OFF of the amplifier circuit according to a select signal. The second switch part opens and closes complementarily to the first switch part according to the select signal. The amplifier circuit receives a test clock signal used in a test mode operation state through the second switch part. Further, the amplifier circuit outputs a signal generated by amplifying an input signal serving as the clock signal, or the test clock signal, according to the select signal.

17 Claims, 7 Drawing Sheets

RELATED ART

RELATED ART

CLOCK SIGNAL AMPLIFICATION CIRCUIT, CONTROL METHOD THEREOF, AND CLOCK SIGNAL DISTRIBUTION CIRCUIT

INCORPORATION BY REFERENCE

This application is based upon and claims the benefit of priority from Japanese patent application No. 2009-235012, filed on Oct. 9, 2009, the disclosure of which is incorporated herein in its entirety by reference.

BACKGROUND

1. Field of the Invention

The present invention relates to a clock signal amplifier circuit, a control method thereof, and a clock signal distribution circuit, and more particularly, to a clock signal amplifier circuit capable of performing a high-speed operation, a control method thereof, and a clock signal distribution circuit capable of performing a high-speed operation.

2. Description of Related Art

A clock signal distribution circuit which incorporates a CML (Current Mode Logic) driver (for example, disclosed in Japanese Unexamined Patent Application Publication No. 2008-227696) is used as a high-speed clock signal distribution means in an electric circuit such as an LSI (Large Scale Integration). FIG. 5 is a block diagram showing a configuration of a common clock signal distribution circuit 400. First, the configuration of the clock signal distribution circuit 400 will be described with reference to FIG. 5. As shown in FIG. 5, the clock signal distribution circuit 400 includes a PLL (Phase Locked Loop) 41, a test clock generator 42, a CML driver 43, a CML driver 44, and a selector 45.

The PLL 41 serves as a clock generator and outputs a clock signal CLK and a clock signal CLKB to the selector 45. The clock signal CLKB is an inverted signal of the clock signal CLK. The test clock generator 42 outputs a test clock signal TST and a test clock signal TSTB to the selector 45.

The selector 45 operates according to a select signal SEL. For example, when the select signal SEL is a HIGH signal, the selector 45 performs a normal operation. In this case, the selector 45 outputs the clock signal CLK and the clock signal CLKB to the CML driver 43. On the other hand, when the select signal SEL is a LOW signal, the selector 45 performs a test mode operation. In this case, the selector 45 outputs the test clock signal TST and the test clock signal TSTB to the CML driver 43. Note that the test clock signal TSTB is an inverted signal of the test clock signal TST.

The CML driver 43 amplifies the clock signals CLK and CLKB or the test clock, signals TST and TSTB, and outputs the amplified signals to the CML driver 44. The CML driver 44 amplifies the signals output from the CML driver 43, and outputs the amplified signals from output terminals OUT and OUTB as output signals.

In other words, the clock signal distribution circuit 400 can be switched between a normal operation state and a test mode operation state by changing the select signal SEL supplied to the selector 45.

Next, the CML drivers 43 and 44 will be described. FIG. 6 is a block diagram showing a configuration of the CML driver 43 serving as a common CML driver. FIG. 7 is a circuit diagram of the CML driver 43. As shown in FIG. 6, input signals IN and INB are supplied to the CML driver 43. The CML driver 43 amplifies the input signals IN and INB, and outputs the amplified signals from output terminals OUT and OUTB as output signals.

Subsequently, the configuration of the CML driver 43 will be specifically described with reference to FIG. 7. As shown in FIG. 7, the CML driver 43 includes a constant current source 46, Nch (N-channel) transistors 47a and 47b, and pull-up resistors 48a and 48b.

One end of the constant current source 46 is connected to a ground voltage. The other end of the constant current source 46 is connected to the sources of the Nch transistors 47a and 47b. The drain of the Nch transistor 47a is connected to a supply voltage through the pull-up resistor 48a. The gate of the Nch transistor 47a receives the input signal INB. The drain of the Nch transistor 47b is connected to the supply voltage through the pull-up resistor 48b. The gate of Nch transistor 47b receives the input signal IN. The output terminal OUT is connected to a node between the Nch transistor 47a and the pull-up resistor 48a. The output terminal OUTB is connected to a node between the Nch transistor 47b and the pull-up resistor 48b.

Next, an operation of the CML driver 43 will be described. The CML driver 43 is a differential amplifier circuit. Thus, the CML driver 43 amplifies the input signals IN and INB, and outputs the amplified signals from the output terminals OUT and OUTB as output signals. Here, the CML driver 44 has the same configuration as the CML driver 43, and thus description thereof will be omitted.

However, the present inventor has found a problem described below. A selector circuit is used so as to select the clock signal or the test clock signal in the clock signal distribution circuit 400. Generally, the selector circuit has a low frequency limit. This inhibits a high-speed operation of the clock signal distribution circuit. Further, the number of circuit stages increases because of the inserted selector circuit, thereby failing to suppress jitter.

SUMMARY

In view of the above circumstances, an exemplary object of the invention is to provide a clock signal amplifier circuit that can suppress jitter and perform a high-speed operation, and a control method thereof.

In a first exemplary aspect of the invention, a clock signal amplifier circuit includes: an amplifier circuit that amplifies a clock signal; a first switch part that controls ON/OFF of the amplifier circuit according to a select signal; and a second switch part that opens and closes complementarily to the first switch part according to the select signal, in which the amplifier circuit receives a test clock signal used in a test mode operation state through the second switch part, and outputs a signal generated by amplifying the clock signal, or the test clock signal, according to the select signal.

In a second exemplary aspect of the invention, a control method of a clock signal amplifier circuit includes: supplying a clock signal to an amplifier circuit ON/OFF of which is controlled by a first switch part; supplying a test clock signal used in a test mode operation state to the amplifier circuit through a second switch part; opening or closing the first switch part and the second switch part complementarily by controlling the first and second switch parts according to a select signal; and outputting, by the amplifier circuit, a signal generated by amplifying the clock signal, or the test clock signal.

BRIEF DESCRIPTION OF THE DRAWINGS

The above and other aspects, features, and advantages of the present invention will become more apparent from the following description of certain exemplary embodiments when taken in conjunction with the accompanying drawings, in which.

EXEMPLARY EMBODIMENTS

[First Exemplary Embodiment]

Figure 1:
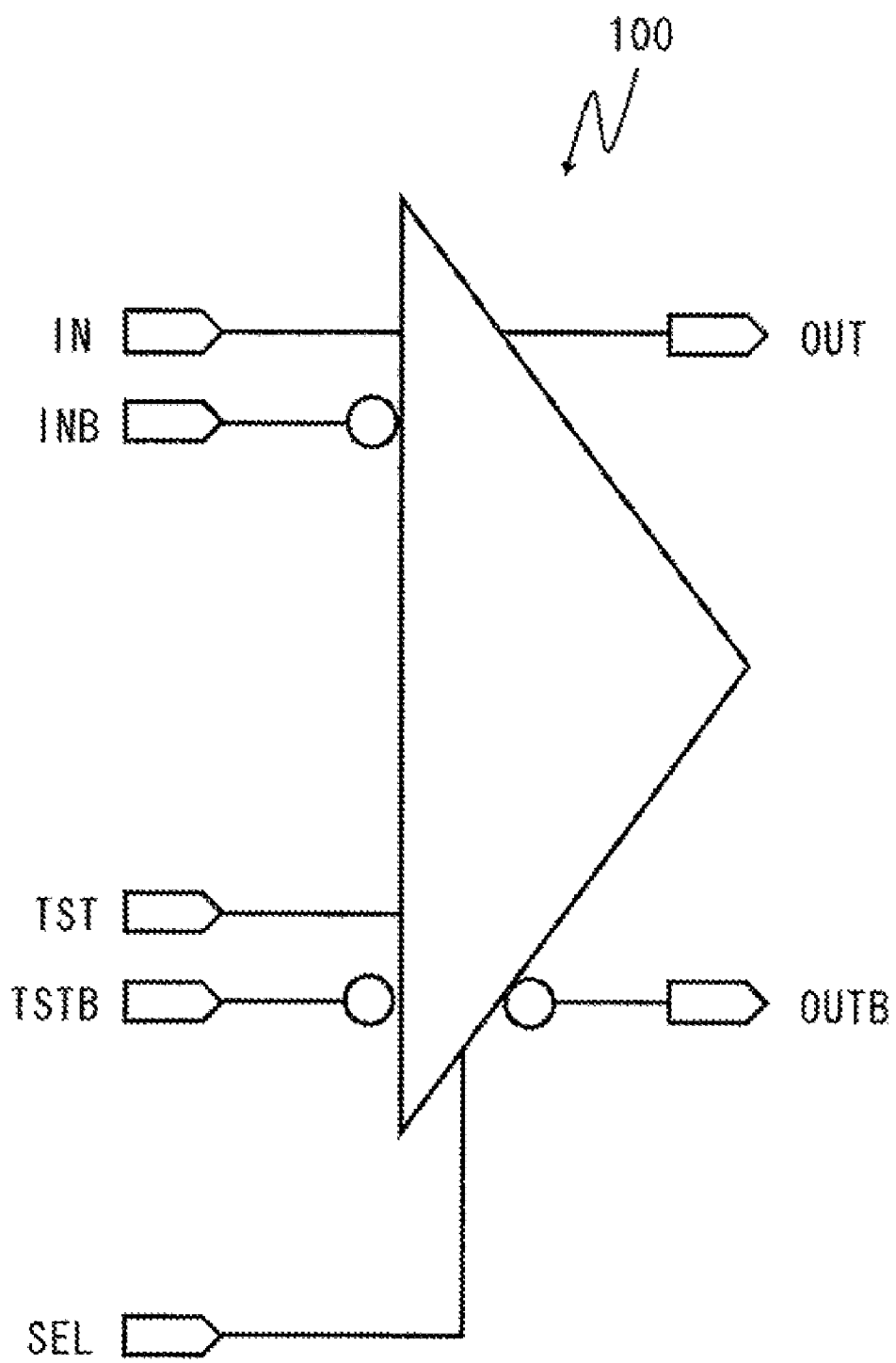
FIG. 1 is a block diagram showing a configuration of a clock signal amplifier circuit 100 according to a first exemplary embodiment.
Figure 2:
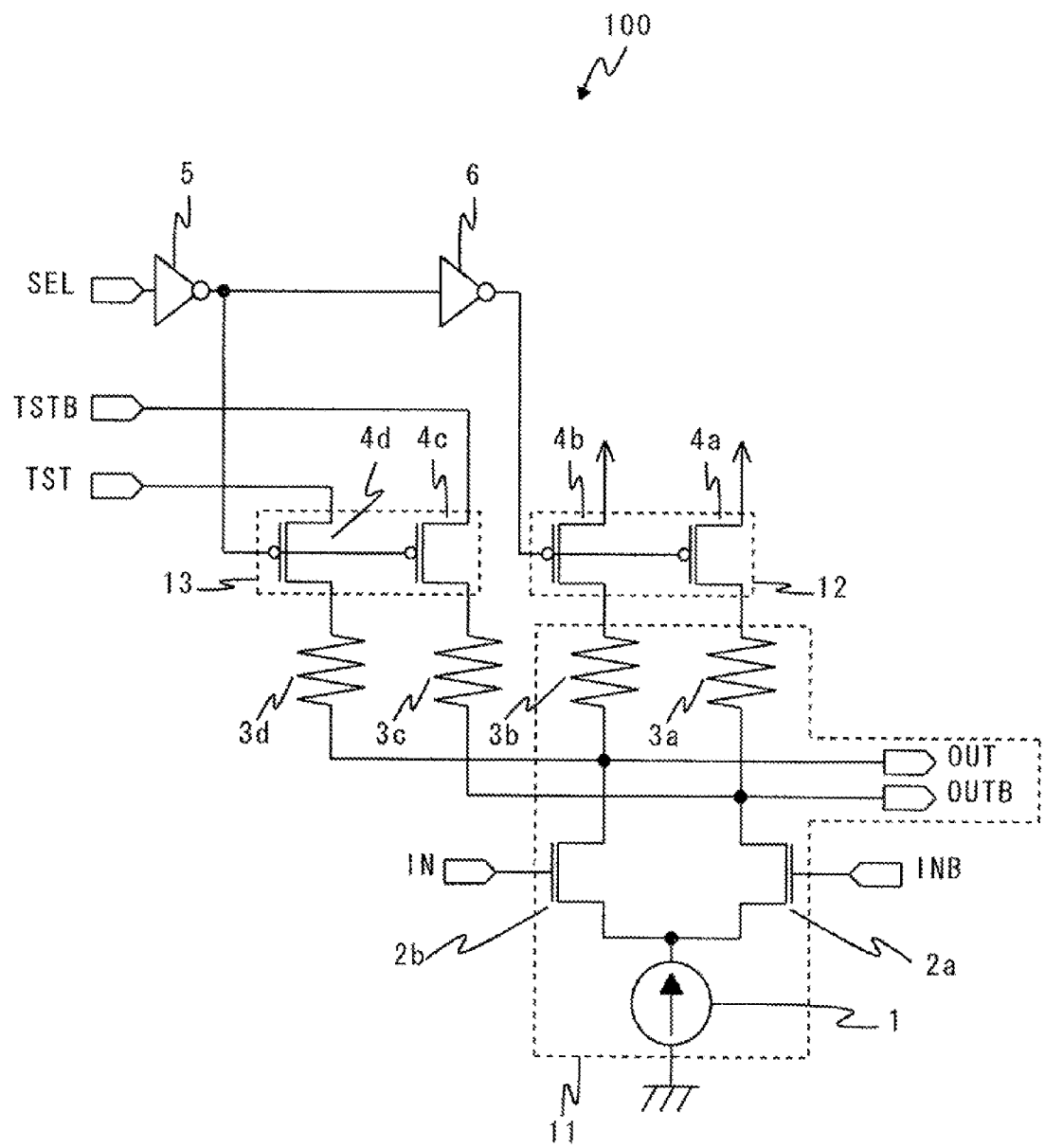
FIG. 2 is a circuit diagram of the clock signal amplifier circuit 100 according to the first exemplary embodiment.

Hereinafter, exemplary embodiments of the present invention will be described with reference to the drawings. FIG. 1 is a block diagram showing a configuration of a clock signal amplifier circuit 100 according to a first exemplary embodiment. The clock signal amplifier circuit 100 functions as the CML driver described above. FIG. 2 is a circuit diagram of the clock signal amplifier circuit 100 according to the first exemplary embodiment. First, a basic configuration and an operation of the clock signal amplifier circuit 100 will be described with reference to FIG. 1. The clock signal amplifier circuit 100 receives input signals IN and INB, test clock signals TST and TSTB, and a select signal SEL. Here, the input signal is a clock signal. The test clock signals are a pair of differential test clock signals used in a test mode operation state.

When the select signal SEL is a HIGH signal, the clock signal amplifier circuit 100 outputs signals generated by amplifying the input signals IN and INB, from output terminals OUT and OUTB, for example. Further, when the select signal SEL is a LOW signal, the clock signal amplifier circuit 100 outputs the test clock signals TST and TSTB from the output terminals OUT and OUTB.

Subsequently, the configuration of the clock signal amplifier circuit 100 will be specifically described with reference to FIG. 2. As shown in FIG. 2, the clock signal amplifier circuit 100 includes a differential amplifier circuit 11, a first switch part 12, a second switch part 13, resistors 3c and 3d, and inverters 5 and 6.

The differential amplifier circuit 11 includes a constant current source 1, Nch (N-channel) transistors 2a and 2b, pull-up resistors 3a and 3b, and the output terminals OUT and OUTB.

One end of the constant current source 1 is connected to a ground voltage, and the other end thereof is connected to the sources of the Nch transistors 2a and 2b. The drain of the Nch transistor 2a is connected to the output terminal OUTB and the pull-up resistor 3a. The drain of the Nch transistor 2b is connected to the output terminal OUT and the pull-up resistor 3b. The gate of the Nch transistor 2a receives the input signal INB. The gate of the Nch transistor 2b receives the input signal IN.

The first switch part 12 includes Pch transistors 4a and 4b. The drain of the Pch transistor 4a is connected to the pull-up resistor 3a. The source of the Pch transistor 4a is connected to a supply voltage. The drain of the Pch transistor 4b is connected to the pull-up resistor 3b. The source of the Pch transistor 4b is connected to the supply voltage.

The second switch part 13 includes Pch transistors 4c and 4d. The drain of the Pch transistor 4c is connected to the output terminal OUT through the resistor 3c. The source of the Pch transistor 4c receives the test clock signal TSTB. The drain of the Pch transistor 4d is connected to the output terminal OUTB through the resistor 3d. The source of the Pch transistor 4d receives the test clock signal TST.

The input terminal of the inverter 5 receives the select signal SEL. The output terminal of the inverter 5 is connected to the input terminal of the inverter 6 and the gates of the Pch transistors 4c and 4d. The output terminal of the inverter 6 is connected to the gates of the Pch transistors 4a and 4b.

Next, the operation of the clock signal amplifier circuit 100 will be specifically described. When the select signal SEL is the LOW signal, the inverter 5 outputs the HIGH signal. Thus, the Pch transistors 4c and 4d turn OFF. Further, the inverter 6 outputs the LOW signal. Thus, the Pch transistors 4a and 4b turn ON. Therefore, the clock signal amplifier circuit 100 outputs the signals generated by amplifying the input signals IN and INB, from the output terminals OUT and OUTB. In sum, the clock signal amplifier circuit 100 operates as a common CML driver.

On the other hand, when the select signal SEL is the HIGH signal, the inverter 5 outputs the LOW signal. Thus, the Pch transistors 4c and 4d turn ON. Further, the inverter 6 outputs the HIGH signal. Thus, the Pch transistors 4a and 4b turn OFF. Therefore, the clock signal amplifier circuit 100 outputs the test clock signals TST and TSTB from the output terminals OUT and OUTB. In sum, the clock signal amplifier circuit 100 operates in a test mode operation state.

In other words, according to the configuration described above, the first switch part 12 and the second switch part 13 are complementarily opened and closed by changing the select signal SEL. This makes it possible to select the output signals from the clock signal amplifier circuit 100. Therefore, according to the configuration described above, it is possible to provide the clock signal amplifier circuit capable of supplying the test clock signals without using the selector circuit. Thus, a test operation and a high-speed operation can be achieved in a circuit which incorporates the CML driver including the clock signal amplifier circuit having the configuration described above.

[Second Exemplary Embodiment]

Figure 3:
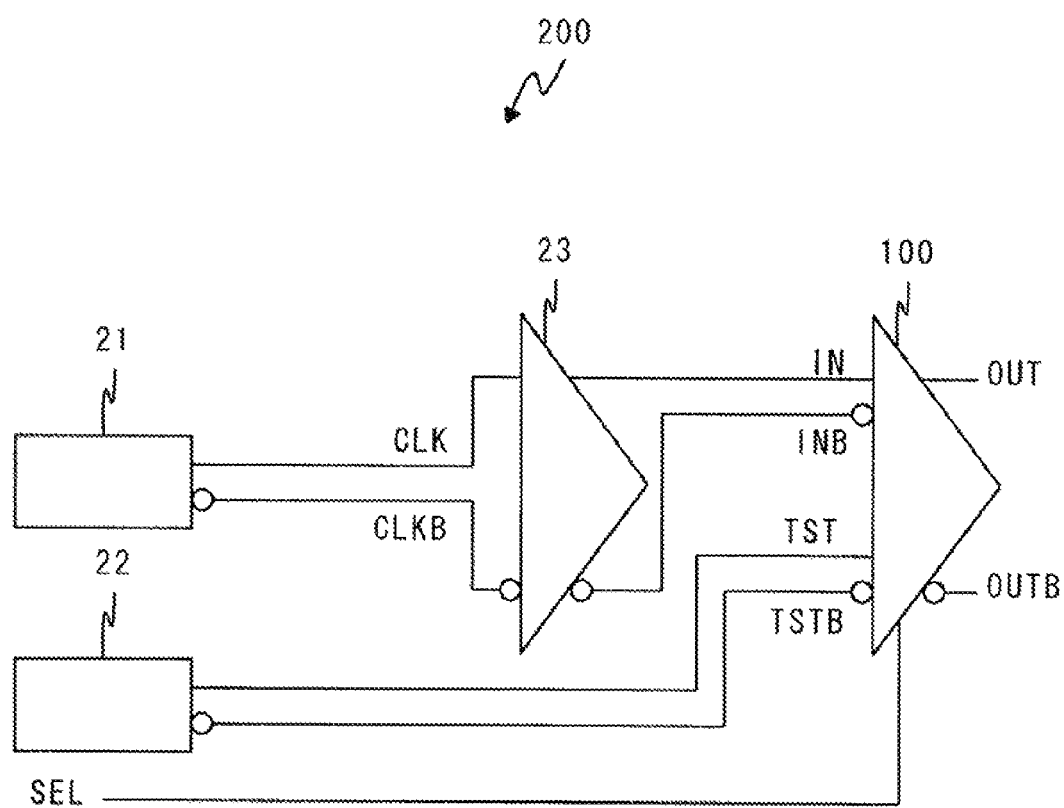
FIG. 3 is a circuit diagram of a clock signal distribution circuit 200 according to a second exemplary embodiment.

Next, a clock signal distribution circuit according to a second exemplary embodiment will be described. FIG. 3 is a circuit diagram of a clock signal distribution circuit 200 according to the second exemplary embodiment. The clock signal distribution circuit 200 according to the second exemplary embodiment incorporates the clock signal amplifier circuit 100 according to the first exemplary embodiment. As shown in FIG. 3, the clock signal distribution circuit 200 includes a PLL (Phase Locked Loop) 21, a test clock generator 22, a CML driver 23, and the clock signal amplifier circuit 100. The PLL 21 is a clock signal generator. The test clock generator 22 generates a pair of differential test clock signals. The CML driver 23 is a common CML driver.

The PLL 21 serves as a clock generator and outputs clock signals CLK and CLKB to the CML driver 23. Note that the clock signal CLKB is an inverted signal of the clock signal CLK. The CML driver 23 amplifies the clock signals CLK and CLKB. Then, the CML driver 23 outputs the amplified signals to the clock signal amplifier circuit 100 as the input signals IN and INB.

The test clock generator 22 outputs the test clock signals TST and TSTB to the clock signal amplifier circuit 100.

The clock signal amplifier circuit 100 outputs signals generated by amplifying the input signals IN and INB or the test clock signals TST and TSTB, from the output terminals OUT and OUTB, according to the select signal SEL.

In other words, according to the present configuration, the first switch part 12 and the second switch part 13 are complementarily opened and closed by changing the select signal SEL. This makes it possible to select the output signals from the clock signal amplifier circuit 100. Therefore, according to the present configuration, it is possible to provide the clock signal distribution circuit capable of supplying the test clock signals without using the selector circuit. Thus, achieve the clock signal distribution circuit capable of performing a test operation and a high-speed operation can be achieved.

[Third Exemplary Embodiment]

Figure 4:
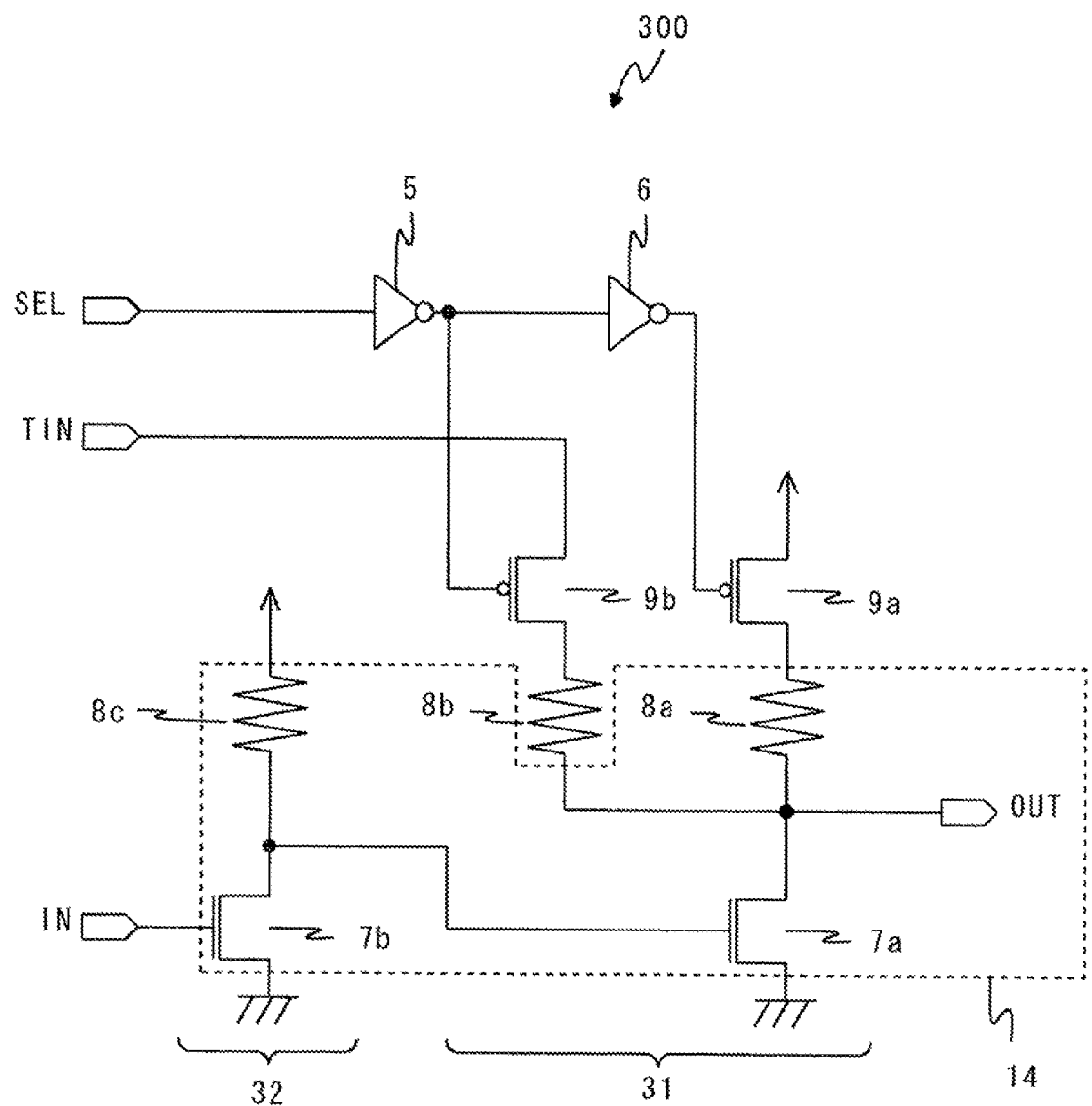
FIG. 4 is a circuit diagram of a clock signal amplifier circuit 300 according to a third exemplary embodiment.
Figure 5:
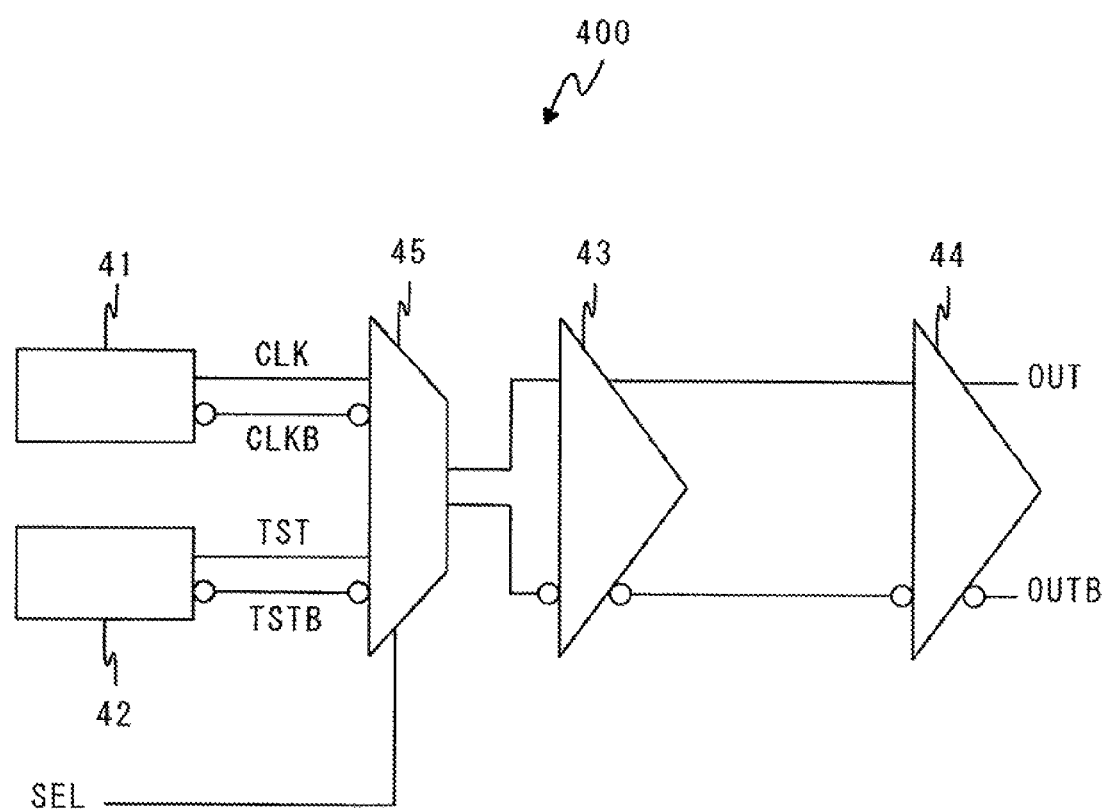
FIG. 5 is a block diagram showing a configuration of a common clock signal distribution circuit 400.
Figure 6:
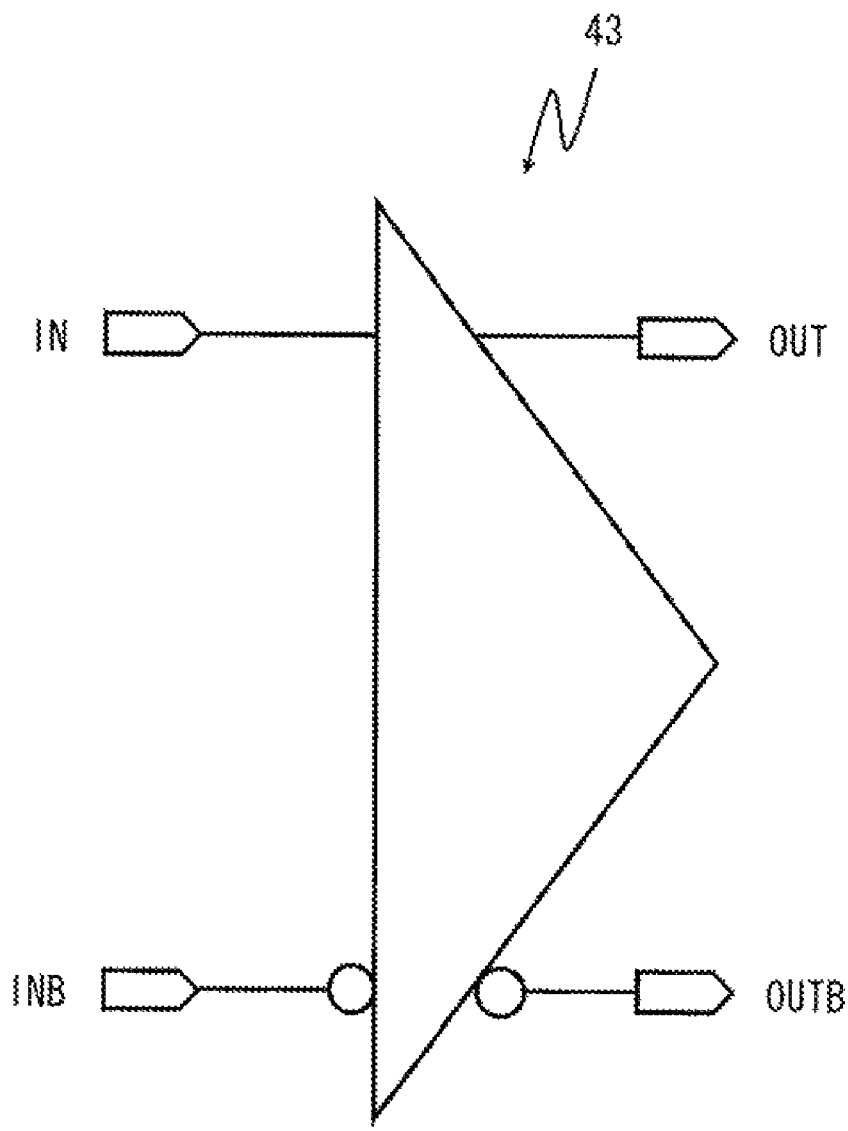
FIG. 6 is a block diagram showing a configuration of a CML driver 43 serving as a common CML driver.
Figure 7:
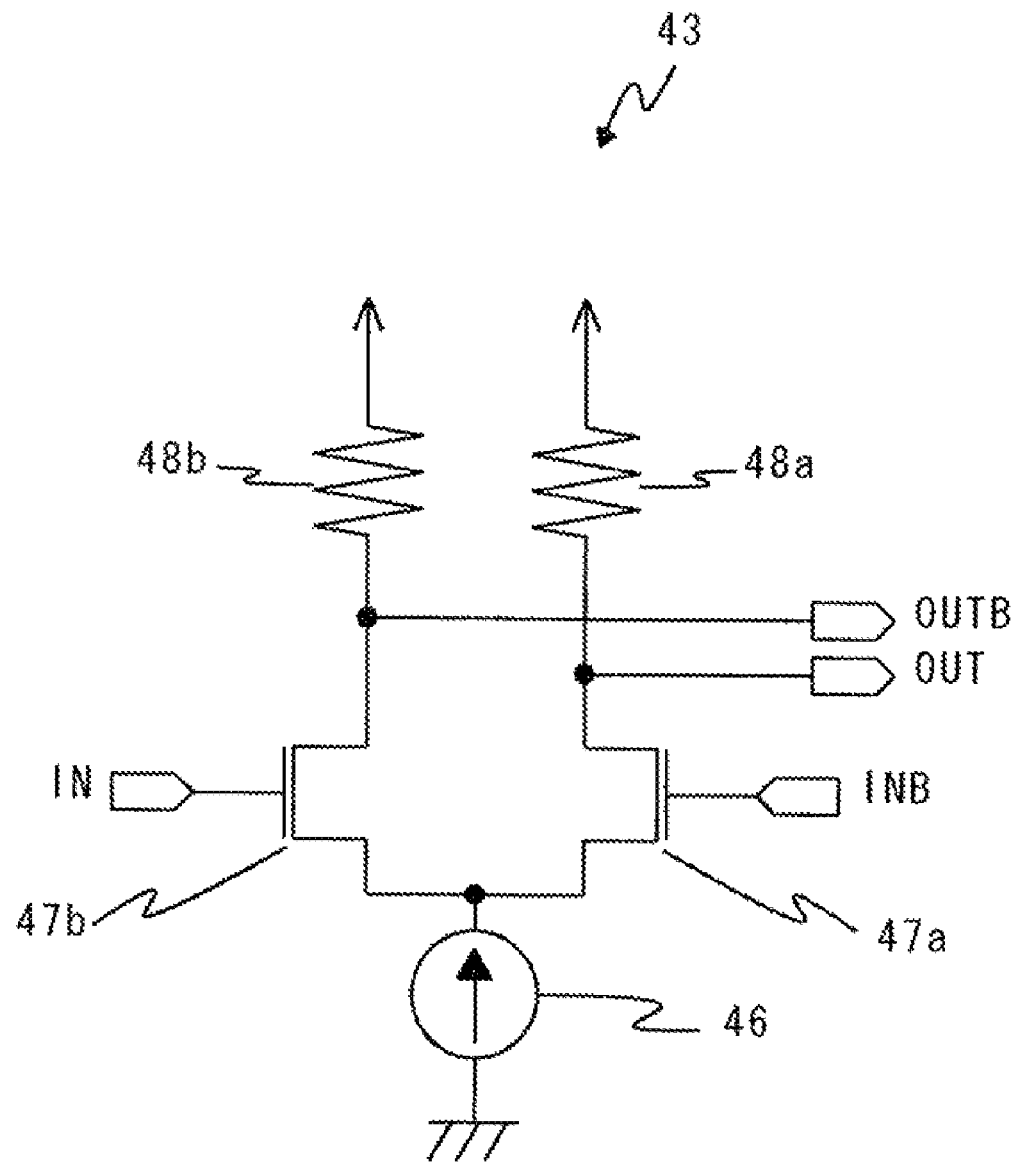
FIG. 7 is a circuit diagram of the CML driver 43.

Next, a clock signal amplifier circuit according to a third exemplary embodiment will be described. FIG. 4 is a circuit diagram of a clock signal amplifier circuit 300 according to the third exemplary embodiment. The clock signal amplifier circuit 300 functions as an open-drain circuit. As shown in FIG. 4, the clock signal amplifier circuit 300 includes two open-drain buffers 31 and 32. Further, the clock signal amplifier circuit 300 includes an amplifier circuit 14, inverters 5 and 6, a resistor 8b, and Pch transistors 9a and 9b.

The amplifier circuit 14 includes Nch transistors 7a and 7b, pull-up resistors 8a and 8c, and the output terminal OUT. The source of the Nch transistor 7a is connected to a ground voltage. The drain of the Nch transistor 7a is connected to the output terminal OUT and the pull-up resistor 8a. The source of the Nch transistor 7b is connected to the ground voltage. The drain of the Nch transistor 7b is connected to a supply voltage through the pull-up resistor 8c. The gate of the Nch transistor 7a is connected to a node between the Nch transistor 7b and the pull-up resistor 8c. The gate of the Nch transistor 7b receives an input signal IN. The input signal IN is a clock signal, for example.

The drain of the Pch transistor 9a is connected to the pull-up resistor 8a. The source of the Pch transistor 9a is connected to the supply voltage. The drain of the Pch transistor 9b is connected to the output terminal OUT through the resistor 8b. The source of the Pch transistor 9b receives a test clock signal TIN. Here, the test clock signal is a clock signal used in a test mode operation state.

The input terminal of the inverter 5 receives the select signal SEL. The output terminal of the inverter 5 is connected to the input terminal of the inverter 6 and the gate of the Pch transistor 9b. The output terminal of the inverter 6 is connected to the gate of the Pch transistor 9a.

Next, an operation of the clock signal amplifier circuit 300 will be specifically described. In the present configuration, the Pch transistor 9a functions as a first switch part. The Pch transistor 9b functions as a second switch part. When the select signal SEL is a LOW signal, the inverter 5 outputs a HIGH signal. Thus, the Pch transistor 9b turns OFF. Further, the inverter 6 outputs the LOW signal. Thus, Pch transistor 9a turns ON. ON/OFF of the Nch transistor 7b is switched according to the input signal IN, thereby controlling an operation of the Nch transistor 7a. Therefore, the output terminal OUT outputs a signal according to the input signal IN. In sum, the clock signal amplifier circuit 300 operates as a common open-drain circuit.

On the other hand, when the select signal SEL is the HIGH signal, the inverter 5 outputs the LOW signal. Thus, the Pch transistor 9b turns ON. Further, the inverter 6 outputs the HIGH signal. Thus, the Pch transistor 9a turns OFF. Therefore, the clock signal amplifier circuit 300 outputs the test clock signal TIN from the output terminal OUT. In sum, the clock signal amplifier circuit 300 performs a test mode operation.

In other words, according to the present configuration, the Pch transistor 9a (first switch part) and the Pch transistor 9b (second switch part) are complementarily opened and closed by changing the select signal SEL. This makes it possible to select the output signals from the clock signal amplifier circuit 300. Therefore, according to the present configuration, it is possible to provide the clock signal amplifier circuit capable of supplying the test clock signals without using the selector circuit. Thus, a circuit incorporating this configuration can achieve a test operation and a high-speed operation.

Each of the above-described embodiments can be combined as desirable by one of ordinary skill in the art.

An exemplary advantage according to the above-described embodiments is to be able to provide a clock signal amplifier circuit that can suppress jitter and performs a high-speed operation, and a control method thereof.

The present invention is not limited to the exemplary embodiments described above, but can be changed as appropriate without departing from the spirit of the present invention. For example, in the clock signal amplifier circuits described above, the Pch transistors and the Nch transistors can be exchanged. In this case, the test mode operation is performed when the select signal SEL is the HIGH signal, and the normal mode operation is performed when the select signal SEL is the LOW signal.

Further, as long as the same functions can be achieved, the configurations of the amplifier circuit, the first switch part, and the second switch part are not limited to the configurations described above. Furthermore, as long as the first switch part and the second switch part can be complementarily opened and closed, the select signal can be supplied by a different method, and the configurations of the first switch part and the second switch part can be arbitrarily changed.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A clock signal amplifier circuit comprising:
an amplifier circuit that amplifies a clock signal;
a first switch part that controls ON/OFF of the amplifier circuit according to a select signal; and
a second switch part that opens and closes complementarily to the first switch part according to the select signal,
wherein the clock signal is supplied to an input of the amplifier circuit through the first switch part in a normal operation state,
wherein the amplifier circuit amplifies the clock signal and outputs an amplified signal in the normal operation state, and
wherein a test clock signal is supplied to an output of the amplifier circuit through the second switch part in a test mode operation state.

2. The clock signal amplifier circuit according to claim 1, wherein
the clock signal comprises a pair of differential clock signals, and
the test clock signal comprises a pair of differential test clock signals.

3. The clock signal amplifier circuit according to claim 2, wherein
the amplifier circuit comprises:

a constant current source that is connected in series with the first switch part between a supply source voltage and a ground source voltage, and supplies a constant current to the amplifier circuit;

a first transistor and a second transistor that are connected in parallel to the constant current source;

a first resistor that is connected in series with the first transistor;

a second resistor that is connected in series with the second transistor;

a first output terminal that is connected to a node between the first transistor and the first resistor; and a second output terminal that is connected to a node between the second transistor and the second resistor, the gate terminal of the first transistor receives one of the pair of differential clock signals, the gate terminal of the second transistor receives the other of the pair of differential clock signals, one of the pair of differential test clock signals is supplied to the node between the first transistor and the first resistor, and the other of the pair of differential test clock signals is supplied to the node between the second transistor and the second resistor.

4. The clock signal amplifier circuit according to claim 3, wherein the first switch part comprises:

a third transistor that is connected in series with the first transistor and the first resistor, and opens or closes according to the select signal supplied to the gate terminal of the third transistor; and a fourth transistor that is connected in series with the second transistor and the second resistor, and opens or closes according to the select signal supplied to the gate terminal of the fourth transistor.

5. The clock signal amplifier circuit according to claim 4, wherein the second switch part comprises:

a fifth transistor that allows one of the pair of differential test clocks to pass according to the select signal supplied to the gate terminal of the fifth transistor; and a sixth transistor that allows the other of the pair of differential test clocks to pass according to the select signal supplied to the gate terminal of the sixth transistor.

6. The clock signal amplifier circuit according to claim 5, wherein the third to sixth transistors have the same conductivity type, the gate terminals of the third transistor and the fourth transistor receive the select signal, and the gate terminals of the fifth transistor and the sixth transistor receive an inverted signal of the select signal.

7. The clock signal amplifier circuit according to claim 5, wherein the third transistor and the fourth transistor have the same conductivity type, the fifth transistor and the sixth transistor have the same conductivity type that is different from that of the third transistor and the fourth transistor, and the gate terminals of the third to sixth transistors receive the select signal.

8. The clock signal amplifier circuit according to claim 5, further comprising:

a third resistor connected in series with the fifth transistor; and a fourth resistor connected in series with the sixth transistor.

9. The clock signal amplifier circuit according to claim 5, wherein the constant current source is connected between the ground source voltage, and the first transistor and the second transistor, the first resistor is connected between the first transistor and the third transistor, and the second resistor is connected between the second transistor and the fourth transistor.

10. A clock signal distribution circuit comprising:

the clock signal amplifier circuit according to claim 2;

a clock signal generator that outputs the pair of differential clock signals; and a test clock signal generator that outputs the pair of differential test clock signals.

11. The clock signal amplifier circuit according to claim 1, wherein the amplifier circuit comprises:

a first transistor that is connected between a supply source voltage and a ground source voltage, the gate terminal of the first transistor receiving the clock signal;

a first resistor that is connected in series with the first transistor;

a second transistor that is connected in series with the first switch part between the supply source voltage and the ground source voltage, the gate terminal of the second transistor being connected to a node between the first transistor and the first resistor; and a second resistor that is connected in series with the second transistor, and the test clock signal is supplied to a node between the second transistor and the second resistor through the second switch part.

12. The clock signal amplifier circuit according to claim 11, wherein the first switch part comprises a third transistor that opens or closes according to the select signal supplied to the gate terminal of the third transistor.

13. The clock signal amplifier circuit according to claim 12, wherein the second switch part comprises a fourth transistor that opens or closes according to the select signal supplied to the gate terminal of the fourth transistor.

14. The clock signal amplifier circuit according to claim 13, wherein the third transistor and the fourth transistor have the same conductivity type, the gate terminal of the third transistor receives the select signal, and the gate terminal of the fourth transistor receives an inverted signal of the select signal.

15. The clock signal amplifier circuit according to claim 13, wherein the third transistor has a conductivity type different from that of the fourth transistor, and the gate terminals of the third transistor and the fourth transistor receive the select signal.

16. The clock signal amplifier circuit according to claim 13, further comprising a third resistor that is connected in series with the fourth transistor.

17. A control method of a clock signal amplifier circuit comprising:

supplying a clock signal to an input of an amplifier circuit through first switch part in a normal operation state, the first switch part controlling ON/OFF of the amplifier circuit;

supplying a test clock signal to an output of the amplifier circuit through a second switch part in a test mode operation state;

opening or closing the first switch part and the second switch part complementarily by controlling the first and second switch parts according to a select signal; and outputting, by the amplifier circuit, a signal generated by amplifying the clock signal in the normal operation state and the test clock signal in the test mode operation state.

* * * * *